United States Patent [19]

Kirkpatrick et al.

[11] 4,197,144
[45] Apr. 8, 1980

[54] METHOD FOR IMPROVING WRITING OF INFORMATION IN MEMORY TARGETS

[75] Inventors: Conilee G. Kirkpatrick; George E. Possin; Virgil L. Stout, all of Schenectady, N.Y.

[73] Assignee: General Electric Company, Schenectady, N.Y.

[21] Appl. No.: 944,385

[22] Filed: Sep. 21, 1978

[51] Int. Cl.² .................... G11C 11/42; H01L 29/78
[52] U.S. Cl. .......................... 148/1.5; 357/24; 357/29; 357/91
[58] Field of Search ................ 357/91, 23, 24; 148/1.5

[56] References Cited

U.S. PATENT DOCUMENTS

| | | | |
|---|---|---|---|
| 3,761,895 | 9/1973 | Ellis et al. | 340/173 CR |
| 3,897,274 | 7/1975 | Stehlin et al. | 148/1.5 |
| 3,929,512 | 12/1975 | Nicholas et al. | 148/1.5 |
| 3,931,632 | 1/1976 | Uchida et al. | 357/23 |
| 3,945,031 | 3/1976 | Kahng et al. | 357/23 |
| 3,952,325 | 4/1976 | Beale et al. | 357/23 |
| 4,021,787 | 5/1977 | Stein et al. | 340/173 R |
| 4,027,320 | 5/1977 | Jacobs et al. | 357/23 |
| 4,035,820 | 7/1977 | Matzen | 357/23 |
| 4,047,974 | 9/1977 | Harari | 148/1.5 |
| 4,081,292 | 3/1978 | Aoki et al. | 148/1.5 |

OTHER PUBLICATIONS

Learn et al., "... Ion-Impl. ... in ... Si/SiO2 System," Jour. Appl. Phys., 48, (1977), 308.
Young et al., "... Electron Trapping ... SiO2 ... Al," Jour. Electron Materials, 6, (1977), 569.

Primary Examiner—L. Dewayne Rutledge
Assistant Examiner—Upendra Roy
Attorney, Agent, or Firm—Geoffrey H. Krauss; James C. Davis; Marvin Snyder

[57] ABSTRACT

The amount of charge written into the insulator layer of an electron-beam-addressed metal-insulator-semiconductor target is increased by increasing the number of defects in the insulator to provide additional charge trapping and storage sites. Ion implantation techniques for accomplishing the increase of charge trapping sites are disclosed.

9 Claims, 4 Drawing Figures

METHOD FOR IMPROVING WRITING OF INFORMATION IN MEMORY TARGETS

BACKGROUND OF THE INVENTION

The present invention relates to information storage techniques and, more particularly, to a novel method for improving the writing behavior of electron-beam-addressed metal-insulator-semiconductor information storage targets.

One form of high-throughput auxiliary memory, useful with large information storage and retrieval systems, is the electron-beam-addressed metal-insulator-semiconductor storage target. The metal-oxide-semiconductor form of this target is described and claimed in U.S. Pat. No. 3,761,895, issued Sept. 25, 1973 and assigned to the assignee of the present invention. The storage target utilizes a semiconductor planar diode structure, typically having an n-silicon layer fabricated upon a p-silicon substrate, with an oxide layer interposed between the n-silicon layer and a conductive (metallic) film. A bit of binary information is stored, at one of a two-dimensional array of possible data sites, in the insulative oxide responsive to impingement thereon of an electron beam, when a first condition of bias between the conductive layer and the n-silicon layer is utilized. The charge stored in the insulative layer is utilized to modulate the signal produced by a reading electron beam, with the modulated signal being produced in the underlying semiconductor diode to achieve a current gain in the target reading mode. The reading gain is susceptible to variations between targets of different processing lots, which undesirable variations appear to be attributable to less-than-optimum storage, in the insulative storage layer, of the charge written into that layer by the writing electron beam. Methods for reducing written charge storage variations, with concurrent reduction of reading gain variations, in a metal-oxide-semiconductor target for use in electron-beam-addressed data storage apparatus, are therefore highly desirable.

BRIEF SUMMARY OF THE INVENTION

In accordance with the invention, the charge storage characteristics of an electron-beam-addressed data storage target of the metal-oxide-semiconductor type are optimized by generating an increased number of defects in the oxide layer adjacent to the oxide-semiconductor layer interface. The density of defects, or trapping sites, directly affects the number of charges storable in the oxide in the writing mode, with subsequent increased reading gain, especially at low total electron beam fluence.

One presently preferred method utilizes ion implantation to generate the defects. A focused beam of accelerated ions is caused to impinge upon the oxide layer, prior to fabrication of the top conductive (metallic) layer thereon, to implant ions within the oxide layer and as close to the oxide-silicon interface as possible. A presently preferred ion is that of silicon, when an insulative layer of silicon oxide is utilized.

Accordingly, it is an object of the present invention to provide novel methods for introducing additional charge trapping sites adjacent to the insulator-semiconductor interface in an electron-beam-addressable metal-insulator-semiconductor data storage target, for reducing variations in reading and writing behavior thereof.

This and other objects of the present invention will become apparent upon consideration of the following detailed description, when taken in conjunction with the drawings.

DETAILED DESCRIPTION OF THE INVENTION

Figure 1:
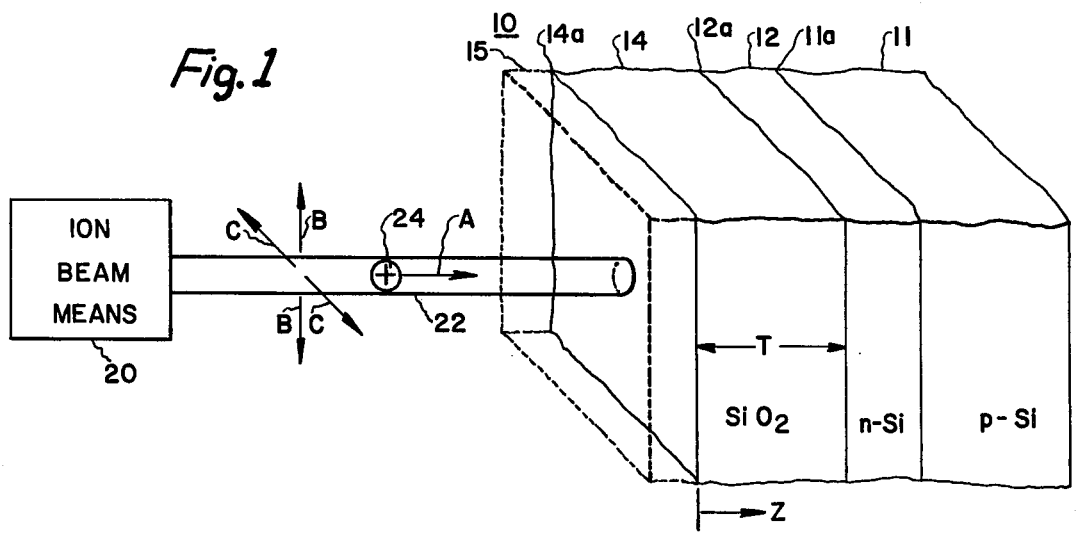
FIG. 1 is an oblique sideview of a portion of a metal-insulator-semiconductor data storage target and of means for projecting a beam of ions into the insulator layer thereof.

Referring initially to FIG. 1, a target 10 for binary data storage by the processes of erasably writing in, and reading out, of electrical charge at each of a two-dimensional array of potential data storage sites, in accordance with the method and apparatus described in the aforementioned U.S. Pat. No. 3,761,895, incorporated herein by reference, includes a semiconductor substrate 11 of a first polarity-type semiconductor material, e.g. p-type silicon. A layer 12 of the opposite polarity-type of the same semiconductor material, e.g. n-type silicon, is fabricated upon one major surface 11a of the substrate. A layer 14 of an insulative material, such as the insulative oxide of the semiconductor material utilized for fabrication of substrate 11 and layer 12 e.g. silicon dioxide ($SiO_2$), is fabricated to a thickness T upon the surface 12a of the semiconductor layer furthest from the substrate. Hitherto, after fabrication of the insulative layer, or layers, a film 15 of a conductive material, such as aluminum, other metals and the like, has been fabricated upon the insulator surface 14a furthest from the planar semiconductor diode structure comprised of substrate 11 and semiconductor layer 12. Data is stored at trapping sites within oxide layer 14 and adjacent to the oxide layer-semiconductor layer interface 12a, responsive to a writing electron beam (not shown) depositing charge at charge trapping sites within each storage site of the 2-dimensional array of possible data storage sites definable upon the target surface, e.g. oxide surface 14a. Thus, the writing electron beam may be modulated to an "off" condition, with essentially zero electron fluence, to prevent charge storage at a site within the oxide corresponding to a first binary value, and the beam may be modulated to an "on" condition, with relatively high electron fluence, to store a relatively large amount of charge at another site within the oxide at which a data bit of the remaining binary value is to be stored. The stored data is read by causing a reading electron beam (also not shown) to impinge upon a particular data site, whereby the stored charge modulates the motion of the minority carriers in the semiconductor responsive to the beam and causes a flow of current to a depletion region formed about the semiconductor layer-substrate interface 11a, as more fully described in the above mentioned patent. The charge stored in the oxide may also be erased.

We have observed large variations in the current flowing to the semiconductor layer-substrate interface in the data reading condition, which variations occur between targets of different processing lots and are believed attributable to differences in the number of sites available within the oxide for storing charge to be written therein, responsive to the writing electron beam. Advantageously, about $10^{13}$ charges should be stored per square centimeter of oxide to store the binary condition in response to the impingment at a storage site of the relatively high fluence electron beam. We have found that this level of charge storage will produce an internal field of about $5 \times 10^6$ volts per centimeter, which is in excess of the $3-4 \times 10^6$ volts per centimeter field required for satisfactory readout gain in this type of data storage target. We have also found that the sites for trapping and storage charge should be relatively close, if not adjacent, to the oxide-semiconductor layer interface surface 12a. To facilitate at least $10^{13}$ charge storage sites per square centimeter adjacent to the interface, we have developed several preferred methods for modifying the physical characteristics of oxide layer 14.

In accordance with one presently preferred method for modifying oxide 14 to generate additional numbers of charge trapping sites adjacent the interface between the oxide and semiconductor layers, ion implantation is utilized prior to the step of fabricating the conductive layer 15 upon the sandwich including the sequential arrangement of oxide layer 14, semiconductor layer 12 and semiconductor substrate 11. Thus, after semiconductor layer 12 is fabricated, as by epitaxial growth and the like methods, upon substrate 11, oxide layer 14 is fabricated to the desired thickness T.

Means 20 is then so positioned as to project a beam 22 of ions 24 in the direction of arrow A such that beam 22 impinges upon oxide surface 14a substantially normal to the surface thereof, with the ions entering the oxide layer. Ion beam means 20 and the oxide-semiconductor sandwich are arranged relative to each other such that the focussed ion beam 22 can be moved in two dimensions, as illustrated by vertical motion arrows B and horizontal motion arrows C, whereby beam 22 is scanned across the entire oxide surface 14a to implant ions 24 therethrough.

The relatively high energy accelerated ions undergo nuclear scattering within the oxide and the kinetic energy of the ions is lost, with the desired defects being produced as damage within the oxide through the displacement of the oxide atoms. The relatively large amounts of damage produced in the oxide layer by ion implantation tend to be concentrated near the end of each ion track, due to the kinetic energy of the ions being lowest thereat whereby the ratio of nuclear to electronic collisions, with the oxide-atoms, is greatest. Thus, the number of charge-storing defects will tend to be near the implanted ions and in the oxide layer adjacent to the insulator-semiconductor layer interface 12a. Suitable ion species and associated implantation energies include: nitrogen (N) ions at about 150keV.; neon (Ne) ions about 200keV.; helium (He) ions at about 30keV.; aluminum (Al) ions at about 350keV.; silicon (Si) ions at about 380keV.; argon (Ar) ions at about 400keV. and the like. It should be noted that the listed energies are for relatively thick oxide layers (on the order of 0.5 microns); thinner layers require less implantation energy. The use of silicon ions is particularly advantageous in an insulative layer 14 of silicon dioxide ($SiO_2$) and utilized with a planar diode structure having silicon as the semiconducting material. In such a silicon based oxide, it is likely that the charge storage sites normally in the oxide (without ion implantation) are provided by dangling silicon bonds, of which there is apparently a high density near the silicon-rich interface. Thus, implantation of silicon ions appears to produce a thicker silicon-rich interface and appears to increase the number of storage sites. Any damage which may be imparted to the n-silicon layer 12 may be annealed, after ion implantation, by treatment at reasonably high temperatures. One particularly advantageous high temperature annealing process step utilizes heating the ion-implanted oxide-semiconductor diode sandwich to about 900° C. in an inert atmosphere and allowing the structure to slowly cool to ambient temperature. After annealing, the conductive film 15 is deposited upon the insulative layer surface 14a and the target is fabricated into an electron beam system for memory use.

Figure 2A:
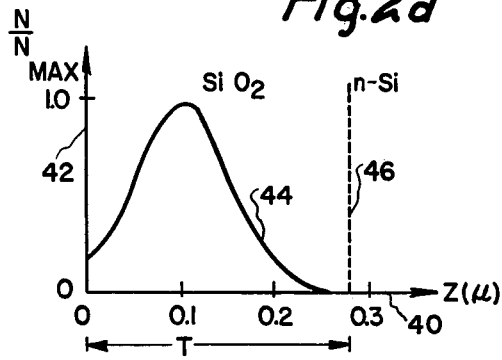
FIGS. 2a and 2b are graphical illustrations of the ion implantation profile in two different oxide-semiconductor sandwiches, in accordance with the principles of the present invention.
Figure 2B:
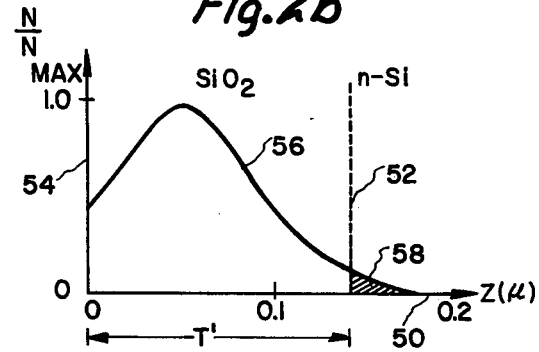
Figure 3:
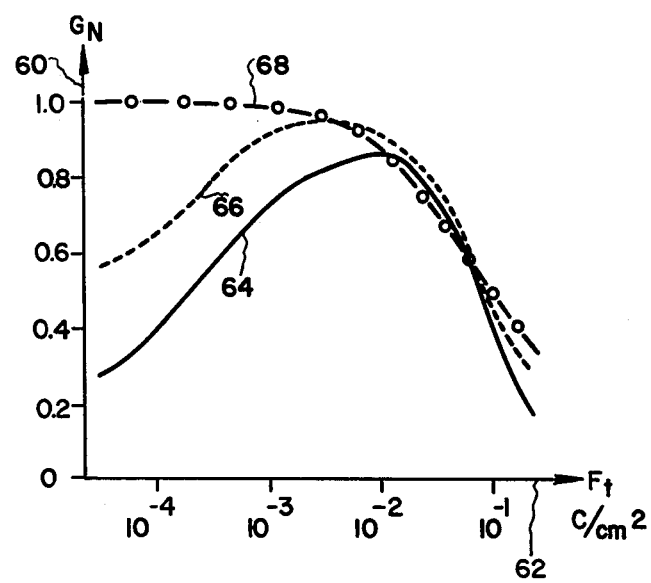
FIG. 3 is a graphical illustration of the normalized reading gain vs. total beam fluence for targets having respectively no implantation and each of two different levels of implantation of ions.

Referring now to FIGS. 2a, 2b and 3, the effects of adding positive charge storage sites in the oxide layer, adjacent to the oxide-semiconductor interface, are illustrated. Ideally, the additional charge storage defects should be located within a few hundred angstroms of the interface, although even under optimum conditions, statistical scattering of beam 22 results in defects distributed in the depth dimension of the insulative layer. Thus, production of an increase of about $10^{13}$ charge storage sites per square centimeter, adjacent to the interface, requires that $10^{13}-10^{14}$ ions per square centimeter be implanted with the beam energy adjusted for ion penetration with an average depth to about the middle of the insulative layer, whereby those ions having somewhat greater penetration depth than the average, are implanted within several hundred angstroms of the interface itself. The implantation profile of FIG. 2a illustrates the relative profile of silicon ions implanted into a silicon dioxide-silicon planar dioxide sandwich, having an oxide layer thickness T on the order of 0.28 microns, at a beam energy on the order of 150keV. The graph of FIG. 2a is scaled in penetration depth Z (in microns) along abscissa 40 and is scaled in the ratio of actual impurity number N to maximum impurity number $N_{MAX}$, along ordinate 42. The curve 44 of implanted charge storage sites illustrates that, for negligible implantation of silicon ions in the n-Si layer, to the right of broken interface line 46, the majority of implanted ions are more than 1000 angstroms above the interface, with only a relatively small amount of additional defects being generated in the few hundred angstroms above the interface.

Referring to FIG. 2b, silicon ions are implanted in a target structure having a lesser thickness T', on the order of 0.15 microns, of a silicon dioxide insulative layer. In this graphical illustration, wherein abscissa 50 is scaled in depth Z below the top surface 14a of the oxide and toward the interface 52, between the oxide and the n-Si layer 12, and the ordinate 54 is scaled in the ratio of number N of defects at a particular depth, relative to the maximum number of defects $N_{MAX}$ implanted at any depth, the charge-trapping defect implantation curve 56 illustrates that silicon ions implanted with an energy of 80keV. provide a relatively significant number of trapping sites in the oxide adjacent the interface, but at the expense of implanting silicon ions in the n-Si layer immediately below the interface, as indicated by the relative number of ions in shaded region 58, within the semiconductor layer. It will also be seen that the relative density of charge trapping sites in the oxide and adjacent to the interface is on the order of one magnitude less than the maximum number of charge trapping sites introduced at any depth into the oxide layer. Accordingly, to introdue additional defect sites on the order of $10^{13}$ per-square-centimeter, ion beam fluence on the order of $10^{14}$ ions per-square-centimeter is required. As previously explained hereinabove, the damage due to the ions in implanted region 58, in the n-silicon layer, must be removed, as by annealing. We have found that at least some of the ion implantation damage in region 58 may be removed by annealing at temperatures as low as about 600° C., although annealing temperatures in the region between about 700°-900° C., are preferred. Annealing temperatures up to about 950° C. can be advantageously utilized, with slow cooling to ambient temperatures. We prefer that the annealing be done in an inert gas or vacuum environment, with annealing in a hydrogen or oxygen atmosphere being undesirable.

In FIG. 3, the normalized reading gain $G_N$ is plotted along ordinate 60, for total electron beam fluence $F_t$ (in Coulombs per square centimeter, $C/cm_2$), plotted along abscissa 62, for: a first target (solid curve 64) devoid of ion implantation; a second target (broken curve 66) having silicon ions implanted at 150keV. to a fluence of about $10^{13}$ per square centimeter; and a third target (chain curve 68) having silicon ions implanted at the same 150keV. implantation energy, to a fluence of about $10^{14}$ per square centimeter. Both Si implanted targets were annealed at 900° C. in $N_2$ gas for 1 hour and then slow cooled as previously described. The insulator thickness is such as to produce an implanted impurity profile similar to FIG. 2b. The targets are cycled through identical erase, write and read sequences, wherein electron beam fluences of about $10^{-7}$–$10^{-6}$ Coulombs per square centimeter are injected into the oxide for each one of the erase, write and read operation. It will be seen that the initial behavior of the targets, for relatively few cycles of the operation, is markedly different. The normalized reading gain tends to stabilize after a sufficient number of erase, write and/or readout operations are performed to achieve a total electron fluence $F_t$ of about $10^{-2} C/cm^2$. In all cases, the storage performance of the oxide reaches a somewhat unacceptable level with a total fluence on the order of $10^{-1}$–$10^{-0} C/cm^2$ e.g. after about 10 million erase, write and/or read operations on that site.

The non-implanted target (64) has a normalized reading gain $G_N$ of about ½ that of the silicon-implanted target, with $10^{13}$ ions per square centimeter (curve 64), for about the first $10^5$ erase, write, and/or read operations. The target with additional implanted silicon ion charge-trapping-defect sites, on the order of $10^{14}$ ions per square centimeter (curve 68), has a normalized reading gain $G_N$ about four times as great as the non-implanted target and about two times as great as the implanted target with $10^{13}$ ions per square centimeter, from the initial usage to about $10^4$ total operations. Thereafter, the normalized reading gains tend to merge to a common value. Thus, implantation of silicon ions at about 150keV. and a fluence of $10^{14}$ ions per square centimeter provides highly improved reading gain performance over the majority of the useful life of a metal insulator-semiconductor storage target of the electron-beam-addressable type.

While one preferred method for improving the writing of information and memory target has been described herein, many variations and modifications will now occur to those skilled in the art. It is our intent, therefore, to be limited only by the scope of the appending claim, rather than the details of the few specific embodiments described herein.

What is claimed is:
1. A method for producing an improved data storage target for a memory addressed by an electron beam, comprising the steps of:
   (a) providing a substrate of a first polarity-type semiconductor material;
   (b) fabricating upon an entire major surface of the semiconductor substrate a layer of an opposite polarity-type of the semiconductor material;
   (c) fabricating a single layer of insulative material upon the entire area of a surface of the semiconductor layer furthest from the semiconductor substrate;
   (d) generating a multiplicity of defects in the entire volume of the insulative material layer adjacent to the interface thereof with said semiconductor layer, to provide sites at which electrical charge will be trapped responsive to inpingement thereon of said electron beam; and
   (e) fabricating a layer of condcutive material upon the entire surface of the insulative layer furthest from the semiconductor layer.
2. The method as set forth in claim 1, wherein step (d) comprises the step of implanting ion within the insulative material layer to generate said multiplicity of defects adjacent to the interface.
3. The method as set forth in claim 2, wherein the ions are of elements selected from the group consisting of nitrogen, neon, helium, aluminum, argon and silicon.
4. The method as set forth in claim 2, wherein the insulative material is silicon dioxide and the implanted ions are silicon ions.
5. The method as set forth in claim 4, wherein the silicon ions are implanted with an energy of between about 80keV. and about 350keV.
6. The method as set forth in claim 2, wherein the number of ions implanted is sufficient to generate from about $10^{13}$ to about $10^{14}$ additional defects sites per square-centimeter, within a distance on the order of hundreds of angstroms into the insulative layer from the insulative layer-semiconductive layer interface.
7. The method as set forth in claim 2, wherein step (d) further includes the step of annealing the ion-implanted target to remove any damage to the semiconductor layer thereof.
8. The method as set forth in claim 7, wherein the annealing step is carried out at a temperature from about 600° C. to about 900° C.
9. The method as set forth in claim 8 wherein the annealing step is carried out in one of vacuum and an inert gas atmosphere.

* * * * *